(12) United States Patent
Meagley et al.

(10) Patent No.: US 7,138,158 B2
(45) Date of Patent: *Nov. 21, 2006

(54) FORMING A DIELECTRIC LAYER USING A HYDROCARBON-CONTAINING PRECURSOR

(75) Inventors: Robert P. Meagley, Aloha, OR (US); Michael D. Goodner, Hillsboro, OR (US); Andrew W. Ott, Hillsboro, OR (US); Grant M. Kloster, Lake Oswego, OR (US); Michael L. McSwiney, Hillsboro, OR (US); Bob E. Leet, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 503 days.

This patent is subject to a terminal disclaimer.

(21) Appl. No.: 10/377,061

(22) Filed: Feb. 28, 2003

(65) Prior Publication Data
US 2004/0170760 A1    Sep. 2, 2004

(51) Int. Cl.
*B05D 3/10* (2006.01)
*C23C 16/00* (2006.01)

(52) U.S. Cl. ............... 427/271; 427/248.1; 427/256; 427/255.28; 427/249.15; 427/255.23

(58) Field of Classification Search ............ 438/660; 427/271, 248.1
See application file for complete search history.

(56) References Cited

U.S. PATENT DOCUMENTS

| | | | |
|---|---|---|---|
| 5,872,401 A | 2/1999 | Huff et al. | 257/758 |
| 5,950,107 A | 9/1999 | Huff et al. | 438/669 |
| 6,171,945 B1* | 1/2001 | Mandal et al. | 438/622 |
| 6,238,751 B1* | 5/2001 | Mountsier | 427/574 |
| 6,329,118 B1 | 12/2001 | Hussein et al. | 430/270.1 |
| 6,383,951 B1* | 5/2002 | Li | 438/781 |
| 6,391,777 B1* | 5/2002 | Chen et al. | 438/687 |
| 6,541,398 B1* | 4/2003 | Grill et al. | 438/780 |
| 6,583,048 B1* | 6/2003 | Vincent et al. | 438/623 |
| 6,596,467 B1* | 7/2003 | Gallagher et al. | 430/314 |
| 2003/0186172 A1* | 10/2003 | Lu | |
| 2003/0198742 A1* | 10/2003 | Vrtis et al. | 427/255.28 |

OTHER PUBLICATIONS

Grill, Alfred. Plasma enhanced chemical vapor deposited SiCOH dielectrics: from low-k to extreme low-k interconnect materials. Journal of Applied Physics, vol. 93, No. 3, Feb. 1, 2003.
Hendricks, Neil H., Ph.D. Innovations in Interconnect Technology. Jul. 16, 2001. http://www.semi.org.
Chapman, Lance. International SEMATECH Fabricates Electrically Yielding 2-Level Metal Copper Dual Damascene Via Chains with NANOGLASS® E Extra Low-k Spin-On Dielectric. Sunnyvale, California, Nov. 14, 2001.

* cited by examiner

*Primary Examiner*—Timothy Meeks
*Assistant Examiner*—Cachet I. Sellman
(74) *Attorney, Agent, or Firm*—Trop, Pruner & Hu, P.C.

(57) ABSTRACT

In one embodiment, the present invention includes introducing a precursor containing hydrocarbon substituents and optionally a second conventional or hydrocarbon-containing precursor into a vapor deposition apparatus; and forming a dielectric layer having the hydrocarbon substituents on a substrate within the vapor deposition apparatus from the precursor(s). In certain embodiments, at least a portion of the hydrocarbon substituents may be later removed from the dielectric layer to reduce density thereof.

26 Claims, 6 Drawing Sheets

FORMING A DIELECTRIC LAYER USING A HYDROCARBON-CONTAINING PRECURSOR

BACKGROUND

The present invention relates to forming layers on a substrate and more particularly to forming a dielectric layer using a hydrocarbon-containing material.

Semiconductor devices typically include metal layers that are insulated from each other by dielectric layers. It is desirable that these dielectric layers which are made of an insulative material have a relatively low dielectric constant. While such dielectric layers may be made of various materials, silicon dioxide is one material used, however it has a higher dielectric constant than is desired for forming advanced semiconductor devices. One material used to provide a low dielectric constant ($K_{eff}$) is a carbon doped oxide (CDO). Typically, CDO films are formed using a vapor deposition process. It is desirable however, to obtain a dielectric layer having a lower $K_{eff}$ than possible using conventional vapor deposition processing and precursor materials.

Certain materials used as dielectric films may be instead formed using a spin-on process. While such spin-on materials may have a relatively low $K_{eff}$, they typically have poor mechanical strength and may suffer from structural integrity problems during subsequent processing. Thus there is a need for a dielectric layer that has reliable mechanical strength for subsequent processing and a relatively low dielectric constant upon device completion.

DETAILED DESCRIPTION

Figure 1A:
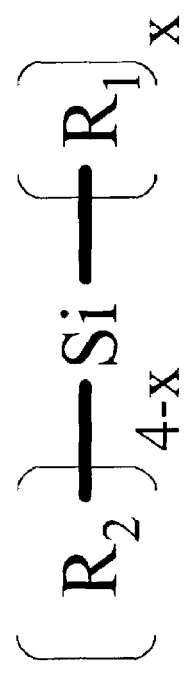
FIGS. 1A–1B are chemical structures of substituted precursors in accordance with various embodiments of the present invention.

In one embodiment of the present invention, a dielectric layer may be deposited using a hydrocarbon substituted silicon-based precursor (a "substituted precursor"). In various embodiments, the hydrocarbon substituents may vary in chain length, branching, sterics, C/H ratio, heteroatoms and other chemical attributes to control resulting material composition and engineering properties (e.g., activation energy ($E_a$), carbon to silicon (C/Si) ratio, rate of degradation, and $K_{eff}$). In some embodiments, large hydrocarbon substituents may act as porogenic functional groups.

In other embodiments, a percentage of a substituted precursor may be co-deposited with conventional silicon oxide and CDO precursor(s) (hereafter "conventional precursors"), which include, but are not limited to tetraethylorthosilicate (TEOS), TOMCATS, dimethyldimethoxysilane (DMDMOS), and OMCTS. The percentage of substituted precursor to conventional precursor may vary from a minimal amount (e.g., less than 5%) to 100%. This percentage may vary based upon the morphology, mechanical strength, C/Si ratio, and/or the porogenic characteristics desired of the dielectric film. In certain embodiments, the percentage of substituted precursor to conventional precursor may be between approximately 10% to approximately 50%.

After deposition of the dielectric layer, various subsequent processing may be performed. For example, metal interconnects may be formed in or on the dielectric layer via a dual damascene or other process. After the desired subsequent processing has been completed, the hydrocarbon functionality of the substituted precursors may be removed (hereafter referred to as "post-treatment") to form a dielectric layer with greater porosity and a lower dielectric constant. While the dielectric constant obtained may vary in different embodiments, in certain embodiments, the dielectric constant may be reduced to below 3.0 and even 2.5. More so, in embodiments in which the substituted precursor includes a large moiety, the dielectric constant may be reduced to approximately 2.0.

In different embodiments, a dielectric layer may be deposited using various techniques, including for example physical vapor deposition (PVD), chemical vapor deposition, (CVD), or plasma enhanced chemical vapor deposition (PECVD). One example deposition may be thermal deposition of a substituted precursor with a conventional molecular precursor such as TEOS, TMOS, and the like. Similarly, deposition may be accomplished via plasma assisted deposition of a substituted precursor with a molecular precursor such as TEOS, DMDMOS, and the like. Alternately, the reaction of a substituted precursor and a silane-based precursor with an oxygen source (such as oxygen or water), or a mixture of any of the above techniques may be used to deposit the dielectric layer (e.g., an interlayer dielectric (ILD)).

Deposition of the dielectric layer may be accomplished using a conventional reaction chamber operating at conventional temperatures and pressures. In certain embodiments, the thickness of the deposited dielectric layer may be between approximately 100 Angstroms and approximately 10,000 Angstroms.

In certain embodiments, the substituted precursor may be engineered to take up additional space in the CDO lattice and modulate its engineering properties (including $K_{eff}$, decomposition temperature, decomposition speed, $E_a$, mechanical strength, porosity, pore structure, film uniformity, modulus, hardness, adhesion, cohesive strength, and the like).

Design of a substituted precursor may follow one of several design motifs in accordance with various embodiments of the present invention. In one embodiment, depicted in FIG. 1A, the substituted precursor may have the general formula $[R_2]_{4-x}Si[R_1]_x$, where x equals one, two, or three; $R_1$ may be a functional group that forms Si—O bonds during deposition (i.e., a silanating/alkoxy silanating functional group), for example, H, a halogen, $OCH_3$, $OCH_2CH_3$, or an alkoxy; and $R_2$ may provide porogen functionality via a bulky carbon-based functional group, for example, norbornyl, neopentyl, adamantyl, cyclopentadienyl, methyl adamantyl, an alicyclic, a heterocyclic, a branched alkyl, a straight chain alkyl, or an aromatic. In the case of x=1 (a single silanating group), more than one precursor may be used to build the film to promote bonding between precursor molecules during the deposition process.

Figure 1B:
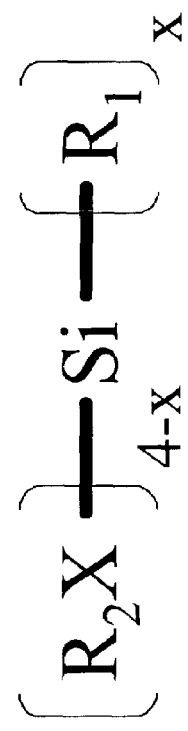

In another embodiment, depicted in FIG. 1B, the substituted precursor may have the general formula $[R_2X]_{4-x}Si[R_1]_x$, where X is a heteroatom, such as O, N, or S, for example; and x, $R_1$ and $R_2$ may be as above.

In still another embodiment, the substituted precursor may have the general formula $[R_2]_xSi[R_1]_y$, where $R_1$, $R_2$ and x are as above and y is one or two, depending on the value of x.

Figure 2C:
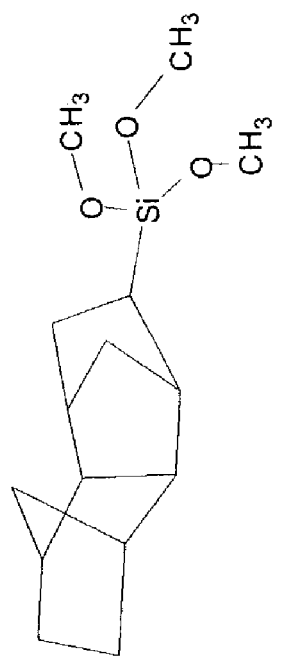
FIGS. 2A–2C are chemical structures of substituted precursors in accordance with various embodiments of the present invention.
Figure 2B:
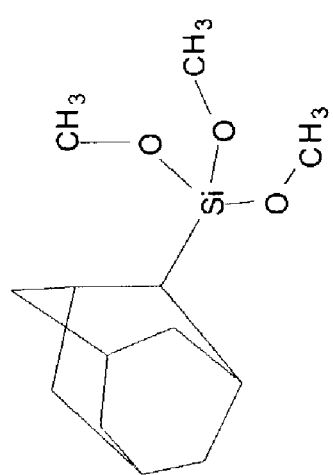
Figure 2A:
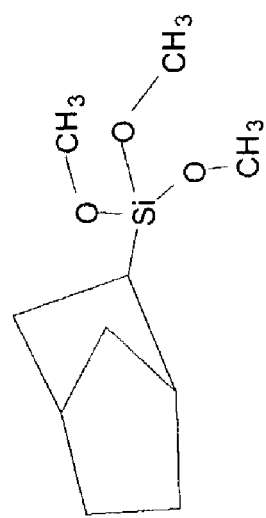

Referring now to FIGS. 2A–2C, shown are example substituted precursors for use in forming dielectric layers in accordance with various embodiments of the present invention. As shown in FIG. 2A, in one embodiment a substituted precursor may be norbornyl trimethoxysilane. As shown in FIG. 2B, in a second embodiment a substituted precursor may be adamantyl trimethoxysilane. As shown in FIG. 2C, in a third embodiment a substituted precursor may be dicyclopentadienyl trimethoxysilane. In other embodiments, substituted precursors may include trietoxynorbornylsilane, tethered cage, substituted cage (2-methyl-2-(triethoxysilyl) norbornane), aryl functionality (benzyl and phenyl), straight chain, and branched chain, and fluorocarbon substitutions. More so, derivatives or analogs of these compounds may also be used as substituted precursors in certain embodiments.

While the silicon content of the precursors of FIGS. 2A–2C is shown as single silicon atoms, it is to be understood that in other embodiments dimeric and oligomeric species, such as disilanes, diazides, silsesquioxanes and others, may be used. Hydrocarbon substituents may have many possible substitution patterns in such multinuclear systems.

Heteroatom substituents may serve several functions, including direction of plasma activation and energy transfer during deposition, promotion of reactivity at specific locations, as well as modulation of decomposition rate and mechanism, and the thermal and mechanical properties of the deposited film. Examples of heteroatoms and functionality include halogen, nitrogen, nitro group, diazo group, and azo group, for example.

Figure 3A:
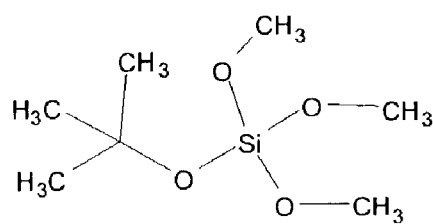
FIGS. 3A–3E are chemical structures of substituted precursors in accordance with various embodiments of the present invention.
Figure 3B:
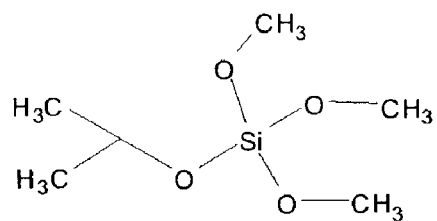
Figure 3C:
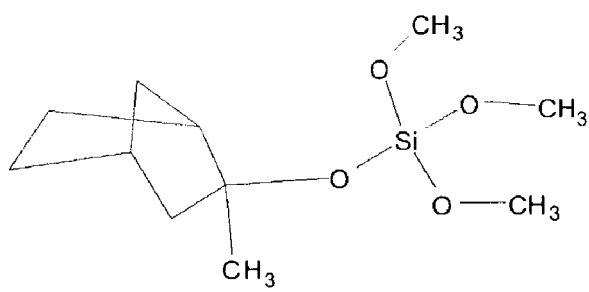
Figure 3D:
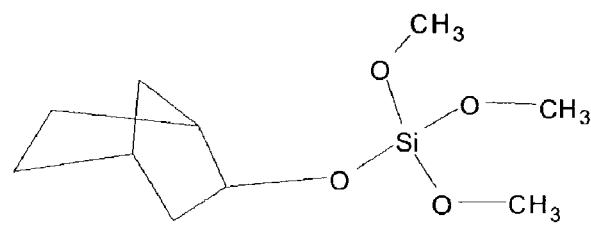
Figure 3E:
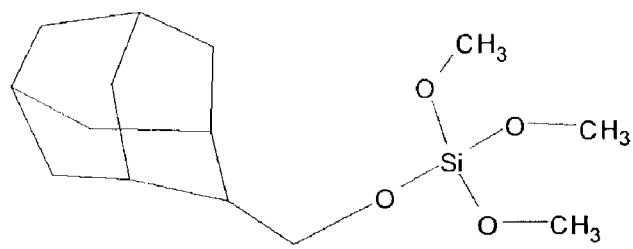

In certain embodiments, films may be deposited using multiple substituted precursors having differing activation energies for degradation and differing amounts of hydrocarbon bulk available for loss. Referring now to FIGS. 3A–3E, shown are example substituted precursors for use in forming dielectric layers in accordance with other embodiments of the present invention. As shown in FIG. 3A, in one embodiment a substituted precursor may be tertbutoxy trimethoxysilane. As shown in FIG. 3B, in a second embodiment a substituted precursor may be isoproxy trimethoxysilane. As shown in FIG. 3C, in a third embodiment a substituted precursor may be alpha methyl norbornyl oxytrimethoxysilane. As shown in FIG. 3D in a fourth embodiment a substituted precursor may be norbornyl oxytrimethoxysilane. As shown in FIG. 3E, in a fifth embodiment a substituted precursor may be adamantyl methoxy trimethoxysilane. As shown in FIGS. 3A–3E, the hydrocarbons are bound to the silicon through a linker moiety (e.g., oxygen). In other embodiments, other derivatives or analogs may be bound to the silicon.

In certain embodiments in which post-treatment of a single precursor is performed, the precursor may have multiple different hydrocarbon functionalities. In one embodiment, two of these sites may be silanating functional groups to form the silicon-oxygen backbone of the dielectric layer, while a third site may be an organic functional group that is desired to be incorporated into the dielectric layer, and a fourth site may be a sacrificial functional group. Such a precursor is depicted in FIG. 4.

For example, in one embodiment two alkoxy groups may be attached to form the silicon-oxygen backbone. In this example, a third site may be a functional group that attaches to the silicon molecule at one or two points (denoted by R in FIG. 4). For example, a ring structure, such as a tetra-substituted carbon in the beta position or another structure stabilized against beta-hydride elimination may be used. As an example, FIG. 5A depicts a norbornyl-functionalized trimethoxysilane, and FIG. 5B depicts a β,β-dimethylnorbornyl trimethoxysilane, which is stabilized against beta-hydride elimination. This third site may be a sterically large molecule. In other embodiments, this third site may be an electron-accepting functional group, for example, a phenyl group, such as a benzene ring, or an amide group having a conjugated double bond or an alternating double bond single bond structure. Alternately the third site may be a polydentate ligand or other functional group which is multiply bonded to the silicon atom. Examples of such ligands include, but are not limited to, 2,4-pentanedioate (acetyl acetonate; acac), 2,2,6,6-tetramethyl-3,5-heptanedionate (thd), dipivaloylmethane (dpm), and bipyridine (bpy).

Figure 4:
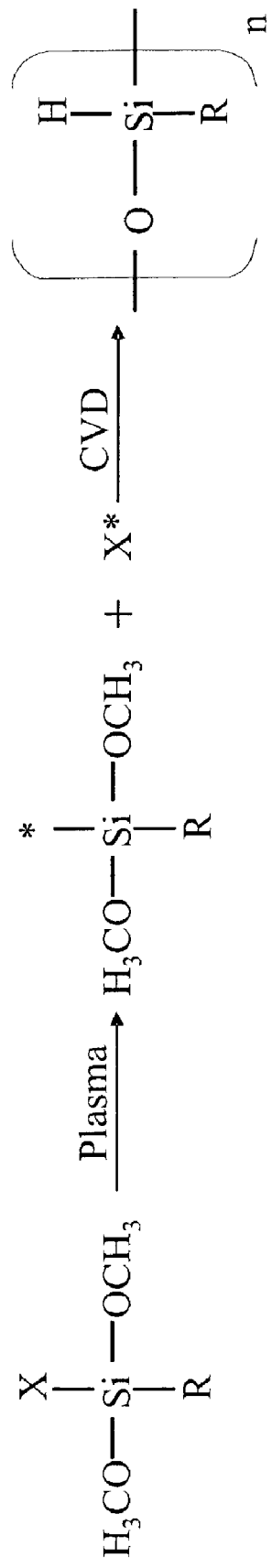
FIG. 4 is an example plasma enhanced chemical vapor deposition reaction in accordance with one embodiment of the present invention.
Figure 5B:
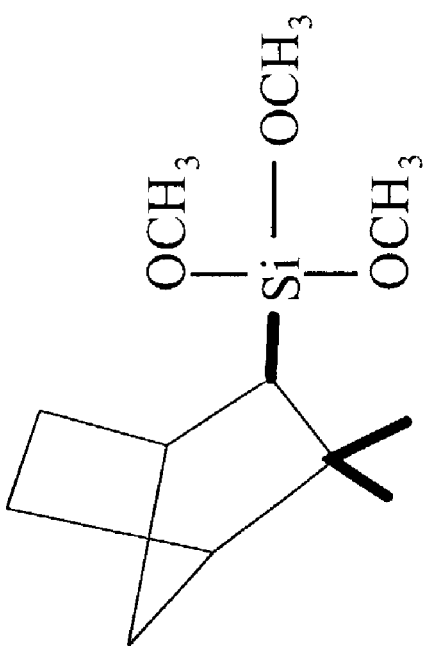
FIGS. 5A–5B are chemical structures of substituted precursors in accordance with several embodiments of the present invention.
Figure 5A:
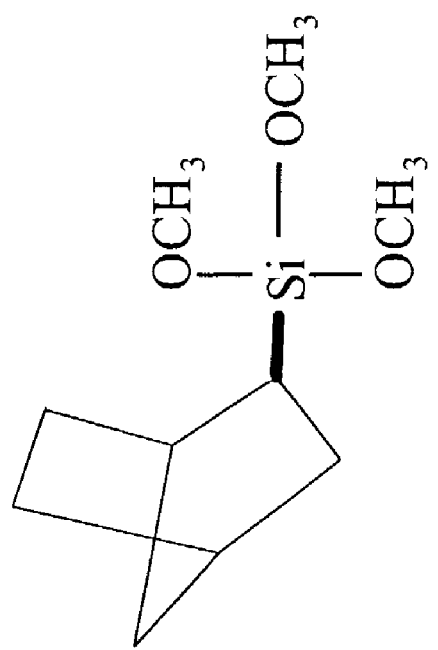

In various embodiments, a fourth site attached to the silicon molecule may be, for example, an alkoxy, an alkyl, a sacrificial functional group or the same functional group chosen for the third site (denoted as X in FIG. 4).

In one embodiment, the third and fourth sites may be functional groups having different reaction pathways. For example, one functional group may be very reactive and be the primary reaction pathway for monomer activation and subsequent film deposition, in accordance with the scheme depicted in FIG. 4. The second functional group may be large and unreactive so that it may be incorporated into the film and may be selected to avoid common plasma reaction pathways, such as beta hydride elimination or hydrolysis, in certain embodiments. In certain embodiments, sacrificial components that decompose preferentially may include, but are not limited to, halogens, olefins, functional groups highly susceptible to beta-hydride elimination such as ethyl or ethoxy groups, or other functional groups (e.g., a precursor with two different organic functional ethoxy groups, either of which may be susceptible to post-treatment if incorporated into the film).

In an embodiment in which an Si-based organic precursor is reacted with an oxidizing agent, reactions may be modulated by steric hindrance of surface reactions or by electronic effects of substituents groups. In such an embodiment, Si—H or Si—R (where R is a small functional group) may be susceptible to attack by water (i.e., hydrolysis) to create a new hydroxyl group, which can act as an active site for film growth. Alternately, a much larger functional group that can block access to reactive sites will not react and will be incorporated into the film. Thus, surface reactions of the film may be prevented during film growth, enabling incorporation of organic porogens which may be later removed from the film. In addition to the organic precursors described above, hydroxyl-substituted functional groups may also be used (such groups may be chemically bound to the film at more than one site).

As discussed above, in one embodiment the precursor may be stabilized during deposition by adding a sacrificial functional group that will fragment preferentially during decomposition, leaving the rest of the molecule (including the organic porogen) intact. Such a precursor may have the sacrificial functional group attached directly to the silicon (shown as X in FIG. 4) or attached to the organic portion (also shown as X in FIG. 6).

Referring now to FIG. 4, shown is an example PECVD reaction in accordance with one embodiment of the present invention. As shown in FIG. 4, a silicon molecule has four sites attached thereto, namely two alkoxy groups, a third site which is a functional group (R) desired to be incorporated into the dielectric film, and a fourth site which is a sacrificial functional group (X). In one embodiment, X may be a functional group which is especially labile under plasma deposition conditions, such as a halogen, an olefin (e.g., a vinyl group), or a moiety susceptible to beta-hydride elimination (e.g., an ethyl group). As shown in FIG. 4, the sacrificial functional group (shown as X* after the reaction) is not incorporated into the dielectric film.

Figure 6:
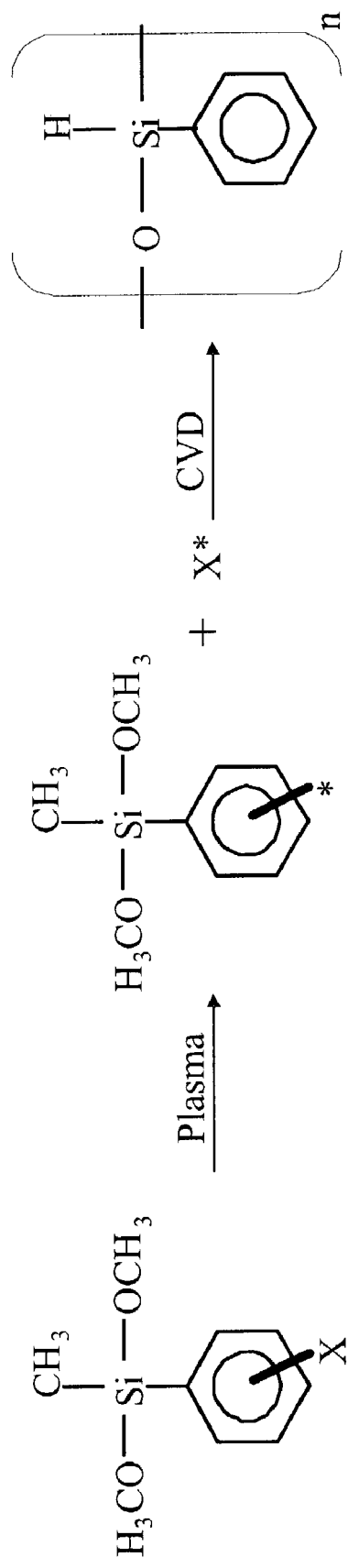
FIG. 6 is an example plasma enhanced chemical vapor deposition in accordance with a second embodiment of the present invention.

Referring now to FIG. 6, shown is an example PECVD reaction in accordance with a second embodiment of the present invention. As shown in FIG. 6, a silicon molecule has four sites attached thereto. In this embodiment, in addition to the two alkoxy groups, a methyl group and an organic moiety (e.g., the benzene ring shown in FIG. 6) are attached directly to the silicon molecule. In this embodiment, the sacrificial functional group (X) is attached to the organic moiety, rather than the silicon molecule itself. As discussed above with regard to FIG. 4, X represents a functional group which is especially labile under plasma deposition conditions. As shown in FIG. 6, the sacrificial functional group (shown as X* after the reaction) is not incorporated into the dielectric film. While FIG. 6 shows a sacrificial group attached to an aromatic functionality which is attached directly to the silicon, other aromatic groups or non-aromatic groups may be used and thus incorporated into the film during deposition.

In one embodiment, reaction conditions may be chosen so that the reaction/decomposition of one functional group is much faster than the other so that organic functional groups may be included in the film. These groups may be removed during later post-treatment to reduce the dielectric constant of the film.

In one embodiment, the dielectric layer may be used as a substrate for desired subsequent processing. For example, a dual damascene process may be performed to form metal interconnects in the dielectric layer.

Certain embodiments of the present invention may provide hydrocarbon bulk for loss, and subsequent removal of the hydrocarbon bulk may increase the porosity of the dielectric layer. When the porosity of the dielectric layer increases, the $K_{eff}$ decreases. The stoichiometry of the original film (and thus the ratio of precursors) depends upon the desired final $K_{eff}$.

In one embodiment, after the metal stack (i.e., metal interconnect) is complete, the dielectric layer may be subjected to an additional process (the aforementioned "post-treatment") to remove the hydrocarbon substitutions in the matrix (and the accompanying bulk). However, it is to be understood that in other embodiments, hydrocarbon removal may occur at other points in the process flow, such as after chemical mechanical planarization, if a particular integration scheme dictates.

In one embodiment, thermal decomposition may be employed to remove the substituted precursor. In certain embodiments, the thermal removal may occur at temperatures between approximately 200°Celsius (C.) and approximately 500° C. The duration of such thermal removal may also vary in different embodiments, and may range from approximately one minute to approximately two hours, in certain embodiments.

All or substantially all of the substituted precursor may be removed to provide for increased porosity in one embodiment. However, in other embodiments, particularly where the substituted precursor includes a large cage, for example, a methyl-based precursor, a greater portion of the substituted precursor (i.e., the methyl group) may remain in the dielectric layer after the removal process.

The removal process may be aided by a photo-acid generator or other catalysts in certain embodiments. For example, an acid or other catalyst may be co-deposited with the precursors which may later aid in removal of the substituted precursor. Such acids may include Lewis and Brønsted acids, for example.

In other embodiments, the removal process may include a plasma etch or ashing process. Such etching or ashing may be performed using conventional parameters and materials.

While the above embodiments relate to substituted precursors, it is to be understood that in certain embodiments, hydrocarbon substituted structures may be in a polymer or oligomer form and may be co-deposited (along with conventional polymers or oligomers) on a substrate via a spin-on technique.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a dielectric layer on a substrate, the dielectric layer comprising hydrocarbon substituents;
   forming at least one metal interconnect in the dielectric layer; and
   removing at least a portion of the hydrocarbon substituents from the dielectric layer using catalyst comprising an acid to reduce density of the dielectric layer after forming the at least one metal interconnect.

2. The method of claim 1, further comprising reducing a dielectric constant of the dielectric layer by removing at least the portion of the hydrocarbon substituents.

3. The method of claim 1, wherein the hydrocarbon substituents comprise at least one carbon-based group.

4. The method of claim 1, further comprising obtaining the hydrocarbon substituents from a precursor having a formula [R2]4−xSi[R1]x, wherein R1 comprises a functional group to form Si—O bonds during deposition, wherein R2 comprises a carbon-based group, and wherein x equals one, two, or three.

5. The method of claim 1, further comprising forming the dielectric layer including the catalyst.

6. A method comprising:
   introducing a first precursor into a vapor deposition apparatus;
   introducing a second precursor into the vapor deposition apparatus, the second precursor comprising a silicon-based precursor including hydrocarbon substituents;
   introducing a catalyst into the vapor deposition apparatus;
   forming a dielectric layer having the hydrocarbon substituents and the catalyst on a substrate within the vapor deposition apparatus from the first precursor, the second precursor, and the catalyst;
   forming at least one metal interconnect in the dielectric layer; and thereafter removing at least a portion of the hydrocarbon substituents from the dielectric layer to reduce density of the dielectric layer using the catalyst.

7. The method of claim 6, further comprising introducing the second precursor in an amount of less than fifty percent of the first precursor.

8. The method of claim 6, further comprising introducing the second precursor having a formula [R2]4–xSi[R1]x, wherein R1 comprises a functional group to form Si—O bonds during deposition, wherein R1 comprises a carbon-based group, and wherein x equals one, two, or three.

9. The method of claim 8, wherein the functional group is selected from the group consisting of H, a halogen, OCH3, OCH2CH3, and an alkoxy.

10. The method of claim 8, wherein the carbon-based group is selected from the group consisting of norbornyl, neopentyl, adamantyl, cyclopentadienyl, methyl adamantyl, an alicyclic, a heterocyclic, a branched alkyl, a straight-chain alkyl, and an aromatic.

11. The method of claim 8, wherein the carbon-based group is beta-substituted.

12. The method of claim 6, further comprising introducing the second precursor having a formula [R2X]4–xSi[R1]x, wherein X comprises a heteroatom, R1 comprises a functional group to form Si—O bonds during deposition, wherein R2 comprises a carbon-based group, and wherein x equals one, two, or tree.

13. The method of claim 12, wherein the functional group is selected from the group consisting of H, a halogen, OCH3, OCH2CH3, and an alkoxy.

14. The method of claim 12, wherein the carbon-based group is selected from the group consisting of norbornyl, neopentyl, adamantyl, cyclopentadienyl, methyl adamantyl, an alicyclic, a heterocyclic, a branched alkyl, a straight-chain alkyl, and an aromatic.

15. The method of claim 6, farther comprising introducing the second precursor having a formula [R2]x Si[R1 ]y, wherein R1 comprises a functional group to form Si—O bonds during deposition, wherein R2 comprises a carbon-based group, and wherein x equals one two, or three and wherein y equals one or two.

16. The method of claim 15, wherein the functional group is selected from the group consisting of H, a halogen, OCH2CH3, and an alkoxy.

17. The method of claim 15, wherein the carbon-based group is multiply bonded to the silicon more than once.

18. A method comprising:
introducing a single precursor into a reaction chamber, the single precursor comprising silicon and a sacrificial group comprising carbon;
introducing a catalyst into the reaction chamber;
forming a dielectric layer on a substrate within the reaction chamber using the single precursor, the dielectric layer including the catalyst co-deposited with the single precursor; and
removing at least a portion of the sacrificial group from the dielectric layer using the catalyst.

19. The method of claim 18, further comprising including a sacrificial functional group attached directly to the silicon.

20. The method of claim 18, further comprising including a sacrificial functional group attached directly to an organic portion of the single precursor.

21. A method comprising:
introducing a single precursor into a reaction chamber, the single precursor comprising a first functional group comprising an organic porogen and a second functional group;
introducing a catalyst into the reaction chamber with the single precursor;
forming a dielectric layer having the organic porogen on a substrate within the reaction chamber using the single precursor, the dielectric layer further having the catalyst; and
forming at least one metal interconnect in the dielectric layer and thereafter removing at least a portion of the organic porogen from the dielectric layer to reduce density of the dielectric layer.

22. The method of claim 21, wherein the second functional group comprises a sacrificial functional group that fragments from a remaining portion of the single precursor.

23. The method of claim 22, further comprising eliminating the sacrificial functional group via beta-hydride elimination.

24. The method of claim 21, wherein the single precursor comprises silicon having a first site, a second site, a third site, and a fourth site, wherein a first hydrogen, halogen, or alkoxy group is attached to the first site, a second hydrogen, halogen, or alkoxy group is attached to the second site, the first functional group is attached to the third site and the second functional group is attached to the fourth site.

25. The method of claim 24, wherein the first functional group and the second functional group have different reaction pathways.

26. The method of claim 21, further comprising removing at least a portion of the organic porogen using the catalyst.

* * * * *

UNITED STATES PATENT AND TRADEMARK OFFICE
CERTIFICATE OF CORRECTION

PATENT NO. : 7,138,158 B2 Page 1 of 1
APPLICATION NO. : 10/377061
DATED : November 21, 2006
INVENTOR(S) : Robert P. Meagley et al.

It is certified that error appears in the above-identified patent and that said Letters Patent is hereby corrected as shown below:

Column 6:
Line 39, after "using" insert --a--;

Column 7:
Line 10, "R1" should be --R2--;
Line 27, "tree" should be --three--;
Line 36, "farther" should be --further--.

Signed and Sealed this

Twenty-seventh Day of February, 2007

JON W. DUDAS
*Director of the United States Patent and Trademark Office*